(12) United States Patent
Murakami (10) Patent No.: US 6,333,961 B1
(45) Date of Patent: Dec. 25, 2001

(54) REFLECTION MASKS, MICROLITHOGRAPHY APPARATUS USING SAME, AND INTEGRATED CIRCUIT MANUFACTURING METHODS EMPLOYING SAME

(75) Inventor: Katsuhiko Murakami, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/635,292

(22) Filed: Aug. 9, 2000

(30) Foreign Application Priority Data

Aug. 18, 1999 (JP) .................................... 11-231393

(51) Int. Cl.$^7$ ...................................................... G21K 5/00
(52) U.S. Cl. .................................................. 378/35; 378/34
(58) Field of Search ................................ 378/35, 34, 85, 378/145

(56) References Cited

U.S. PATENT DOCUMENTS

| | | | |
|---|---|---|---|
| 5,216,539 | * 6/1993 | Boher et al. | 359/359 |
| 5,399,448 | * 3/1995 | Nagata et al. | 430/5 |
| 5,503,950 | * 4/1996 | Mayake et al. | 430/5 |
| 5,528,654 | * 6/1996 | Niibe et al. | 378/84 |
| 5,572,564 | * 11/1996 | Murakami | 378/35 |
| 6,160,867 | * 12/2000 | Murakami | 378/84 |

OTHER PUBLICATIONS

Murakami, Katsuhiko, "Fabrication of Electroplated Reflection Masks for Extreme Ultraviolet Lithography," *Hyomen Gijutsu (Surface Technology)* 49:849–853 (1998).

Murakami et al., "Electroplated Reflection Masks for Soft X-Ray Projection Lithography," *Jpn. J. Appl. Phys.* 34:6696–6700 (1995).

Murakami et al., "Schwartzschild Microscope for Carbon Kα Radiation," *Appl. Optics* 32:7057–7061 (1993).

Joensen et al., "Design of Grazing–Incidence Multilayer Supermirrors for Hard–X–Ray Reflectors," *Appl. Opt.* 34:7935–7994 (1995).

Vernon et al., "Chirped Multilayer Coatings for Increased X–Ray Throughput," *Optics Lett.* 18:672–674 (1993).

* cited by examiner

Primary Examiner—Robert H. Kim
Assistant Examiner—Irakli Kiknadze
(74) Attorney, Agent, or Firm—KLarquist Sparkman, LLP (57) ABSTRACT

Reflection masks are disclosed for use in microlithography (especially soft-X-ray microlithography) in which the linewidth of a circuit pattern defined by such a mask is transferred onto a wafer with reduced adverse effects from reflectance non-uniformities of the mask. A representative reflection mask includes a multilayer mirror that reflects soft X-rays of a prescribed wavelength and a soft-X-ray-absorber layer defining pattern elements. The multilayer mirror is configured to have a thickness period that varies through the thickness dimension of the multilayer mirror.

11 Claims, 10 Drawing Sheets

REFLECTION MASKS, MICROLITHOGRAPHY APPARATUS USING SAME, AND INTEGRATED CIRCUIT MANUFACTURING METHODS EMPLOYING SAME

FIELD OF THE INVENTION

This invention relates to microlithography (transfer of a pattern, defined by a reticle or mask, to a sensitive substrate). Microlithography is a key technology used in the manufacture of semiconductor integrated circuits, displays, and the like. More specifically, the invention pertains to reflection masks, to microlithography apparatus employing such masks, and to methods for manufacturing integrated circuits and the like using such masks and microlithography apparatus.

BACKGROUND OF THE INVENTION

In recent years the progressive miniaturization of active elements in semiconductor integrated circuits has generated a critical need for microlithography technology that can achieve correspondingly finer resolution. This need has led to the development of projection microlithography in which, instead of using ultraviolet light as an energy beam, even shorter wavelengths are used such as soft X-rays having a wavelength in the range of approximately 10 to 15 nm. This new type of microlithography also is termed "EUV" (extreme ultraviolet) microlithography.

In the EUV microlithography wavelength range, the refractive indices of materials tend to be very close to 1. As a result, conventional refractive and reflective optical elements cannot be used. Rather, grazing incidence optical components or multilayer mirrors typically are used. A grazing incidence mirror exploits total reflection resulting from its refractive index being slightly less than 1, and a multilayer mirror exploits a multilayer film ("multilayer") that superimposes and phase-aligns weakly reflected light to produce a net high reflectance of the light.

A conventional EUV microlithography apparatus mainly comprises an X-ray source, an illumination-optical system, a mask, an imaging-optical system, a mask stage, and a wafer (substrate) stage. The apparatus "transfers" an image of a circuit pattern, as defined on the mask, to the wafer. So as to be imprinted with the image, the wafer is coated with an appropriate resist. The image is transferred to (projected onto) the resist by the imaging-optical system. The imaging-optical system typically comprises multiple multilayer mirrors.

The mask typically is a reflection-type mask as disclosed in, for example, Murakami,*Hyomen Gijutsu* (*Surface Technology*) 49:849, 1998; and Murakami et al., *Jpn. J. Appl. Phys.* 34:6696–6700, 1995. In such a mask, an absorber layer (comprising a substance highly absorptive to soft X-ray radiation) is formed, in a prescribed circuit pattern, on or in a multilayer that reflects soft X-rays.

As noted above, an EUV microlithography optical system typically comprises multiple multilayer mirrors and grazing-incidence mirrors. Thus, a soft X-ray beam is reflected multiple times as the beam passes through the optical system. Unfortunately, as the number of multilayer mirrors in the optical system increases, the full-width at half maximum (FWHM) of the reflectance spectrum of EUV light passing through the optical system correspondingly decreases.

Whenever there is a significant difference between the center wavelength of EUV light passing (by reflection) through an optical system consisting of multiple multilayer mirrors and the center wavelength of the EUV light reflected from the multilayer of the reflection mask, a decrease is observed in the combined reflectance of the optical system and the mask. As a result, the quantity of EUV light passing through the optical system and actually reaching the wafer is decreased undesirably.

If, over the plane of the reflection mask, there is a non-uniformity of the thickness period of the multilayer, then the reflectance of the reflection mask at the wavelength used in the microlithography apparatus will vary correspondingly according to position on the mask. This reflectance non-uniformity of the reflection mask is manifest as a non-uniformity in illumination of the wafer (located at an optically conjugate position relative to the reflection mask). As a result, exposure undesirably will vary at different locations on the wafer.

Also, whenever the exposure (i.e., total amount of light energy projected onto the resist on the wafer) exceeds a certain desired range, the linewidth of the circuit pattern transferred onto the wafer exhibits an excessive change that tends to degrade resolution.

SUMMARY OF THE INVENTION

In view of the shortcomings of conventional systems as summarized above, an object of the invention is to provide apparatus and methods that perform microlithographic exposures in which the linewidth of the circuit pattern transferred onto the wafer is substantially unaffected by reflectance non-uniformities of the reflection mask.

To such end, and according to a first aspect of the invention, reflection masks are provided for use especially in microlithography using soft X-rays (i.e., extreme ultraviolet or "EUV" microlithography). A representative embodiment of such a reflection mask comprises a multilayer mirror and an absorptive layer. The multilayer mirror reflects incident electromagnetic radiation (e.g., soft X-rays of a prescribed wavelength). The absorptive layer, superposed on the multilayer mirror, defines elements of a pattern defined by the mask. Through the thickness dimension of the multilayer mirror, the laminations have a thickness period that varies with distance through the thickness dimension.

With such a reflection mask, the full-width at half-maximum (FWHM) (in a reflectance spectrum of the electromagnetic radiation from the multilayer mirror) is larger than in conventional reflection masks. As a result, reflectance of the electromagnetic radiation from respective positions on the multilayer mirror exhibits less change with changes in respective center wavelengths of reflected radiation than in conventional reflection masks. This, in turn, produces less change in wafer illumination over the pattern as transferred to the wafer. (As used herein, a "center wavelength" is a wavelength at which a reflective surface exhibits maximum reflectivity.)

In another representative embodiment of a reflection mask according to the invention, the multilayer mirror is formed by laminating, in a first "block," multiple layers having a first thickness period and, in a second "block" superposed on the first block, multiple layers having a second thickness period different from the first thickness period. A "block" in this context is a group of superposed laminated individual layers.

More generally, the multilayer mirror can be formed of multiple (two or more) blocks each having a respective thickness period. With such a configuration, the FWHM in the reflectance spectrum of the multilayer mirror is larger than in conventional reflection masks. Such a configuration is especially effective whenever differences in the distribution of thicknesses of layers comprising the multilayer mirror vary substantially, such as resulting from the formation of the multilayer mirror.

Desirably, for use in reflecting soft X-rays, each block comprises alternating layers of molybdenum and silicon.

In another representative embodiment, the reflection mask comprises a multilayer mirror is formed by laminating multiple layers superposedly such that the multilayer mirror has a thickness period that progressively varies with distance through the thickness dimension of the multilayer mirror. Again, for reflecting X-rays, the multilayer mirror desirably comprises alternating layers of molybdenum and silicon. This configuration is especially useful whenever differences in the distribution of layer thicknesses in the multilayer mirror are relatively small.

According to another aspect of the invention, methods (to be used in microlithography) are provided for reducing adverse effects on the linewidth of the pattern, as transferred to the substrate, caused by a non-uniformity of reflection of illumination light from the reflection mask. In a first step of a representative embodiment of such a method, a reflection mask according to any of the embodiments summarized above is provided. The reflection mask is illuminated with the illumination light, and the reflected illumination light is passed through an optical system to as to form an image of the pattern on the substrate. The illumination light desirably is of a type with which a reflection mask can be used, such as soft X-rays. With such methods, it is possible to prevent substantial drops in reflectance from the mask even if the center wavelength of light reflected from the mask is shifted. Also, because the FWHM in the spectrum of light reflected from the multilayer mirror is large compared to conventional masks, even if the center wavelength of reflected light varies according to respective positions on the mask, the ratio of the change in reflectance to a difference between the center wavelength and the actual wavelength is small. This correspondingly reduces illumination non-uniformities on the wafer.

According to another aspect of the invention, microlithography apparatus are provided. A representative embodiment of such an apparatus comprises an illumination optical system situated and configured to irradiate electromagnetic radiation from a source onto a reflection mask (that defines a pattern to be projected onto a substrate). The apparatus also comprises an imaging-optical system situated and configured to direct portions of the electromagnetic radiation reflected from the reflection mask to the substrate so as to form an image of the pattern on the substrate. The reflection mask comprises a multilayer mirror (that reflects a prescribed wavelength of the electromagnetic radiation) and an absorber layer, superposed on the multilayer mirror, that absorbs the electromagnetic radiation and defines elements of the pattern. The multilayer mirror has a thickness period, through the thickness dimension of the multilayer mirror, that varies through the thickness dimension.

With such apparatus, even if the center wavelength reflected by the mask is shifted, the exposure dose on the wafer exhibits less change than with a conventional reflection mask exhibiting a similar shift in center wavelength. This makes it possible to manufacture integrated circuits with good throughput. In addition, since the FWHM of the reflectance spectrum of light from the multilayer mirror is relatively large, illumination non-uniformity on the wafer is relatively small (compared to conventional apparatus), even if the center wavelength of light reflected from the mask varies significantly with position on the mask. This allows patterns to be transferred with better control of pattern linewidth, thereby increasing the yield of acceptable integrated circuit product.

The foregoing and additional features and advantages of the invention will be more readily apparent from the following detailed description, which proceeds with reference to the accompanying drawings.

BRIEF DESCRIPTION OF THE DRAWINGS

FIG. 2($a$) is a plot of the distribution of thickness period, through the thickness dimension, of a reflective multilayer mirror as used in a conventional reflection mask.

FIGS. 2($b$)–2($d$) are plots of the respective distributions of thickness period, through the thickness dimension, of respective multilayer mirrors as used in respective embodiments of reflection masks according to the invention.

DETAILED DESCRIPTION

The invention is described below in the context of specific embodiments. However, it will be understood that the invention is not limited to the specific embodiments.

Figure 1:
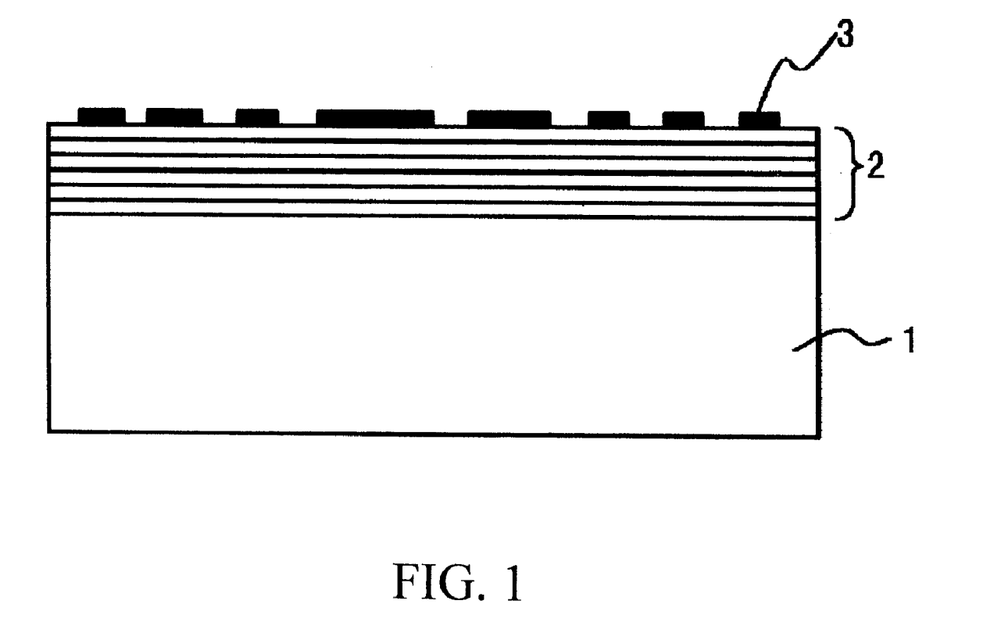
FIG. 1 is a schematic elevational section of a portion of a representative embodiment of a reflection mask according to the invention.

A reflection mask according to a first representative embodiment is shown, in section, in FIG. 1. The reflection mask comprises a multilayer mirror 2 formed on a surface of a substrate 1. An absorber layer 3, defining a prescribed circuit-pattern, is formed on the multilayer mirror 2. As indicated in its name, the multilayer mirror 2 is a reflective laminate of multiple thin layers. The thin layers normally are configured as alternating superposed layers of a first material and a second material. The "thickness period" is the combined thickness, in the thickness dimension of the multilayer mirror, of a layer of the first material and an adjacent layer of the second material.

Figure 2A:
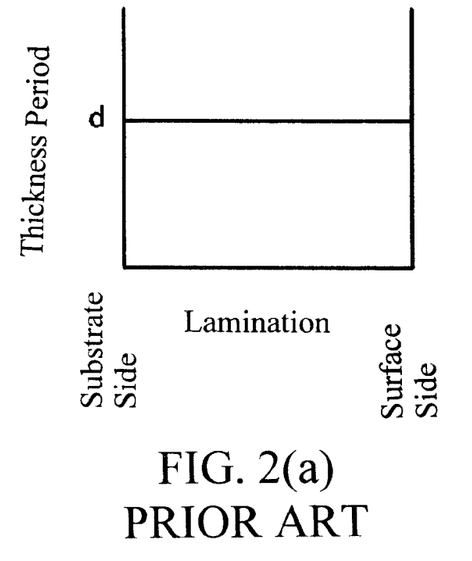
Figure 2B:
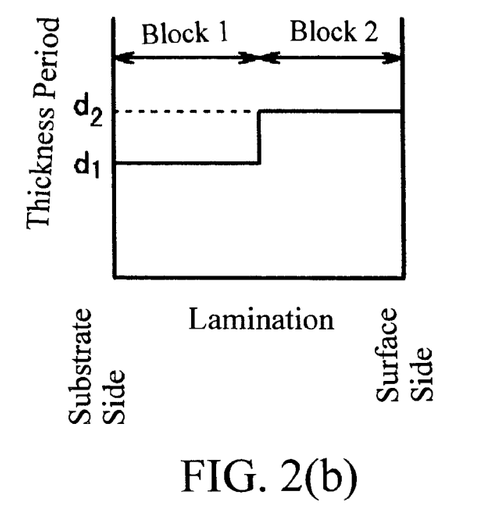
Figure 2C:
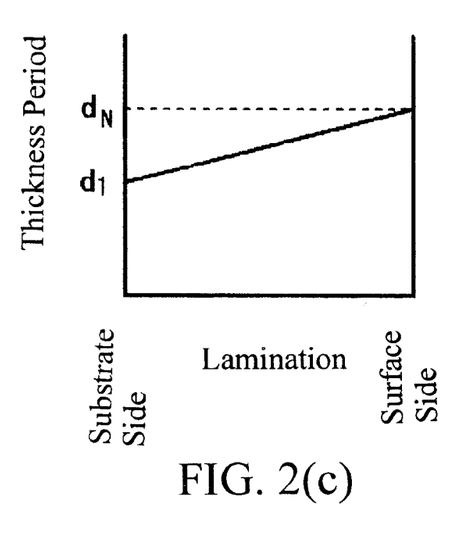
Figure 2D:
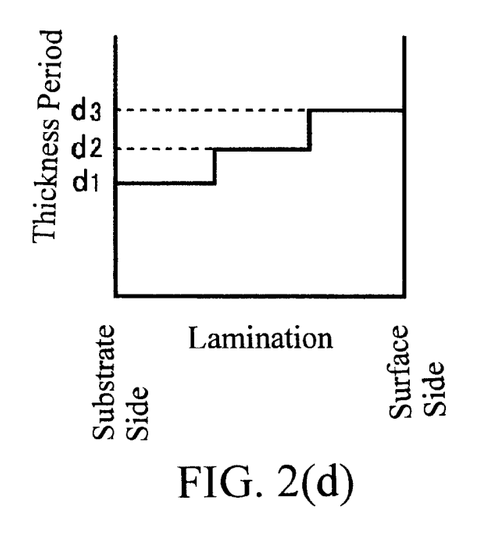

The multilayer mirror 2 does not have a constant thickness period through the thickness dimension of the multilayer mirror 2. Rather, the thickness period changes at least once through the thickness dimension of the multilayer mirror 2. FIGS. 2(b)–2(d) show various exemplary schemes in which the thickness period is changed according to the invention. For comparison purposes, FIG. 2(a) depicts a conventional multilayer mirror having a constant thickness period "d" from the substrate 1 to the surface of the multilayer mirror 2.

As noted above, in a reflection mask according to the invention, the thickness period changes at least once with distance through the thickness dimension of the multilayer mirror 2. For example, in FIG. 2(b), the multilayer mirror has two thickness-period structures (each termed a "block"), wherein the laminations of "block 1" have a thickness period of $d_1$, and the laminations of "block 2" have a thickness period of $d_2$. In the example shown in FIG. 2(c), the first pair of laminations (i.e., the first layer of the first material and the first layer of the second material) is formed, on the substrate side, at a $d_1$ thickness period. With formation of each subsequent pair of laminations (up to a total of N pairs of laminations), the thickness period is changed in a progressive manner such that the thickness period on the surface of the multilayer mirror is $d_N$. In FIG. 2(d), the multilayer mirror has three thickness-period structures (block 1, block 2, and block 3), wherein the laminations in block 1 have a thickness period of $d_1$, the laminations in block 2 have a thickness period of $d_2$, and the laminations in block 3 have a thickness period of $d_3$. The number of blocks can be greater than three; as the number of blocks is increased, the lamination profile more nearly approaches the profile shown in FIG. 2(c). The reflection mask having a three-block profile (FIG. 2(d)) exhibits a reflectance spectrum in which the FWHM is intermediate the FWHM of light reflected from the two-block mask (FIG. 2(b)) and the FWHM of light reflected from the mask in which the thickness period changes progressively (FIG. 2(c)).

Changing the thickness period, through the thickness dimension, of the multilayer mirror of a reflection mask allows the FWHM of the reflectance spectrum of the mask to be manipulated. Note that, in FIGS. 2(b)–2(d), the thickness period of laminations at the surface of the multilayer mirror 2 is larger than the thickness period of laminations adjacent the substrate 1. Alternatively, the thickness period of laminations nearer the surface side may be smaller than of laminations nearer the substrate side.

In a reflection mask according to this embodiment, the greater the difference in thickness period through the thickness dimension of the multilayer mirror 2, the greater the increase in the FWHM of the reflectance spectrum of the multilayer mirror 2; however, reflectance of EUV light from the multilayer mirror 2 generally decreases with such changes. The actual amount of EUV light reaching the wafer is determined by the amount of EUV light, of a predetermined wavelength range, actually transmitted through the optical system including the reflection mask. The amount of EUV light, of the predetermined wavelength range, actually transmitted through the optical system is a function of the amount of EUV light reflected from each mirror of the optical system and from the reflection mask. Hence, according to the invention, within a certain range of wavelengths, the acceptable tolerance range of shifts in center wavelength reflecting from the mask and passing through the optical system can be expanded without causing an excessive decrease in wafer illumination.

Figure 3:
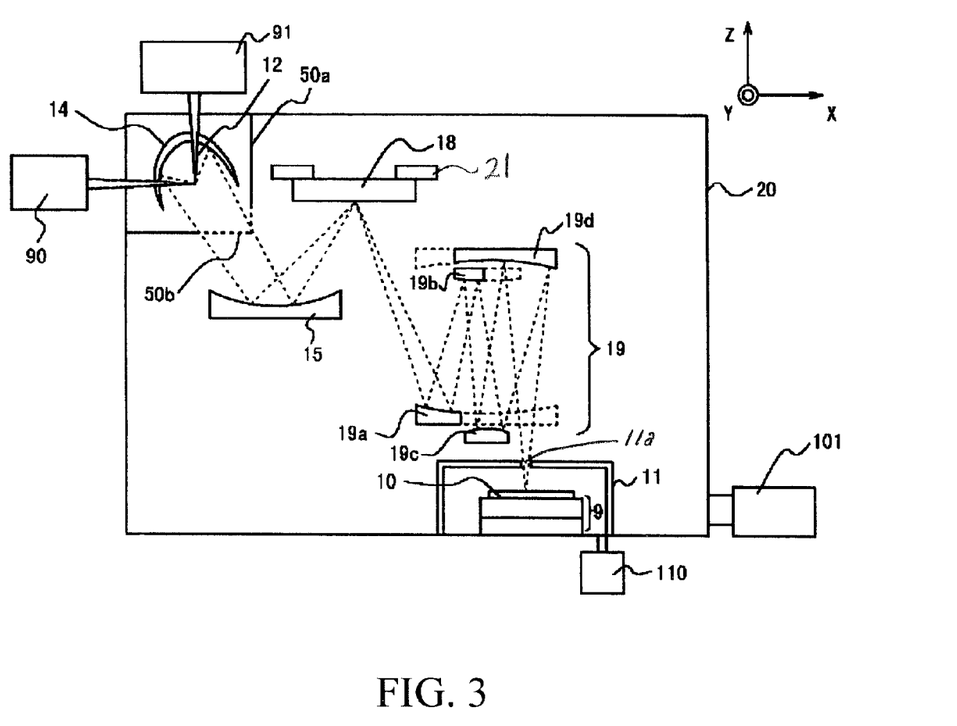
FIG. 3 is a schematic diagram of a microlithographic exposure apparatus employing a reflection mask according to the invention.

A representative embodiment of a microlithography system according to the invention is depicted schematically in FIG. 3. The depicted embodiment is a projection-exposure apparatus employing light in the soft X-ray range (i.e., EUV light) as the exposure-illumination light. Projection-imaging is performed using an imaging-optical system 19, which forms a "reduced" (demagnified) image of the pattern defined by the mask 18 on the wafer 10. In FIG. 3, the optical axis of the imaging-optical system 19 extends in the Z-direction, the plane of the page extends in the X- and Z-directions, and the Y-direction is perpendicular to the plane of the page.

As noted above, the pattern to be transferred onto the wafer 10 is defined by the reflection-type mask 18, which is mounted on a mask stage 21. The wafer 10 is mounted on a wafer stage 9. Typically, exposure is performed in a step-and-scan manner, wherein the mask pattern is projected in successive portions ("shot regions") while synchronously moving the mask stage 21 and wafer stage 9 relative to each other as exposure progresses. Scanning of the mask 18 and wafer 10 typically is performed in a single dimension (here, the X-direction) relative to the imaging-optical system 19. Upon exposing all the shot regions on the mask 18 onto respective regions of the wafer surface, exposure of the pattern onto a die of the wafer 10 is complete. Exposure then can progress stepwise to the next die on the wafer 10.

The soft X-ray beam (i.e., the EUV beam) used as the illumination light for exposure has low transmittance through the atmosphere. Hence, the optical path through which the EUV beam passes desirably is enclosed in a vacuum chamber 20. The vacuum chamber 20 is evacuated using a suitable vacuum pump 101. The EUV beam desirably is produced by a laser-plasma X-ray source comprising a xenon target gas. The laser-plasma X-ray source comprises a laser source 90 (serving as an excitation-light source) and a xenon gas supply 91. The laser-plasma X-ray source is enclosed by a vacuum chamber 50a. The EUV beam produced by the laser-plasma X-ray source passes through a window 50b in the vacuum chamber 50a. The vacuum chamber 50a is separate from the vacuum chamber 20 because debris tends to be generated by a nozzle 12 that discharges the xenon gas.

The laser source 90 is configured to generate laser light having a wavelength that can be within the range from infrared to ultraviolet. For example, a YAG laser or excimer laser can be used. The laser light from the laser source 90 is condensed and irradiated onto the stream of xenon gas (supplied from a gas supply 91) discharged from the nozzle 12. Such irradiation of the stream of xenon gas causes heating of the xenon gas sufficiently to form a plasma. Photons of EUV light are emitted as the laser-excited molecules of xenon gas drop to a lower energy state.

A parabolic mirror 14 is situated in the vicinity of xenon-gas discharge. The parabolic mirror 14 collects and condenses the EUV light produced by the plasma. The parabolic mirror 14 constitutes herein the condenser optical system, and the parabolic mirror 14 is situated such that its focal point is nearly at the locus of discharge of the xenon gas from the nozzle 12. The parabolic mirror 14 comprises a multilayer film ("multilayer") suitable for reflecting the EUV light. The multilayer typically is provided on the concave surface of the parabolic mirror 14. EUV light reflected from the multilayer passes through the window 50b of the vacuum chamber 50a to a condenser mirror 15. The condenser mirror 15 condenses and reflects the EUV light to the reflection-type mask 18. To such end, the condenser mirror 15 also comprises a surficial multilayer that is reflective to EUV light. EUV light reflected from the condenser mirror 15 illuminates the prescribed shot region on the reflection-type mask 18. As referred to herein, the parabolic mirror 14 and condenser mirror 15 collectively comprise the "illumination system" of the FIG.-3 apparatus.

The reflection-type mask 18 is configured with a multilayer EUV-reflective mirror as described above, so further description of the mask 18 is omitted here. As the EUV light reflects from the mask 18, the EUV light becomes "patterned" with pattern data from the mask 18. The patterned EUV light passes through the projection system 19 to the wafer 10.

In this embodiment, the imaging-optical system 19 comprises four EUV-reflective mirrors: a concave first mirror 19a, a convex second mirror 19b, a convex third mirror 19c, and a concave fourth mirror 19d. Each of the mirrors 19a–19d comprises a respective multilayer (reflective to EUV light) applied to a backing material (substrate). The mirrors 19a–19b in this embodiment are arranged so that their respective optical axes are coaxial with each other.

To prevent obstructing the optical path defined by the respective mirrors 19a–19d, appropriate cutouts are provided in the first mirror 19a, the second mirror 19b, and the fourth mirror 19d. (In FIG. 3, the dashed-line portions of the mirrors indicate the respective cutouts.) An aperture stop (not shown) is provided at the position of the third mirror 19c.

The EUV light reflected by the reflection-type mask 18 is reflected sequentially by the first mirror 19a through the fourth mirror 19d to form a reduced image of the mask pattern, based on a prescribed demagnification ratio β (for example |β|=¼, ⅕, or ⅙) within the respective shot region on the wafer 10. The projection system 19 is configured so as to be telecentric on its image side (wafer side).

The reflection-type mask 18 is supported, at least in the X-Y plane, by the movable reticle stage 21. The wafer 10 is supported, desirably in each of the X-, Y-, and Z-directions by the movable wafer stage 9. During exposure of a die on the wafer 10, while EUV light is irradiated to each shot region on the mask 18 by the illumination system, the mask 18 and wafer 10 are moved in a coordinated manner relative to the imaging-optical system 19 at a prescribed velocity according to the demagnification ratio of the imaging-optical system 19. Thus, the mask pattern is scanned progressively and exposed within a prescribed shot range (for a die) on the wafer 10.

During exposure, to prevent gases generated from the resist on the wafer 10 from depositing on and adversely affecting the mirrors 19a–19d of the imaging-optical system 19, the wafer 10 desirably is situated behind a partition 11. The partition 11 defines an aperture 11a through which the EUV light can pass from the mirror 19d to the wafer 10. The space defined by the partition 11 is evacuated by a separate vacuum pump 110. Thus, gaseous contaminants produced by irradiation of the resist are prevented from depositing on the mirrors 19a–19d or on the mask 18, thereby preventing deterioration of optical performance of these components.

In this embodiment, the parabolic mirror 14, the condenser mirror 15, and the mirrors 19a–19d of the imaging-optical system 19 are each configured with a respective multilayer comprising alternating thin-film layers of molybdenum and silicon. The multilayers, used to reflect EUV light having a nominal wavelength of 13.4 nm, have a thickness period of 6.84 nm. Each multilayer has 50 pairs of laminates each comprising a 2.24-nm thick molybdenum layer and a 4.6-nm thick silicon layer. At 13.4 nm nominal wavelength of EUV light, high reflectance is achieved only within a narrow wavelength range (the full-width at half-maximum, or "FWHM," is 0.55 nm). The nominal peak reflectance of 13.4-nm EUV light from each multilayer is 73.8 percent; however, due to imperfections (e.g., surficial diffusion) arising during manufacture of the multilayers, the actually achieved reflectance is lower, approximately 67 percent.

Figure 4:
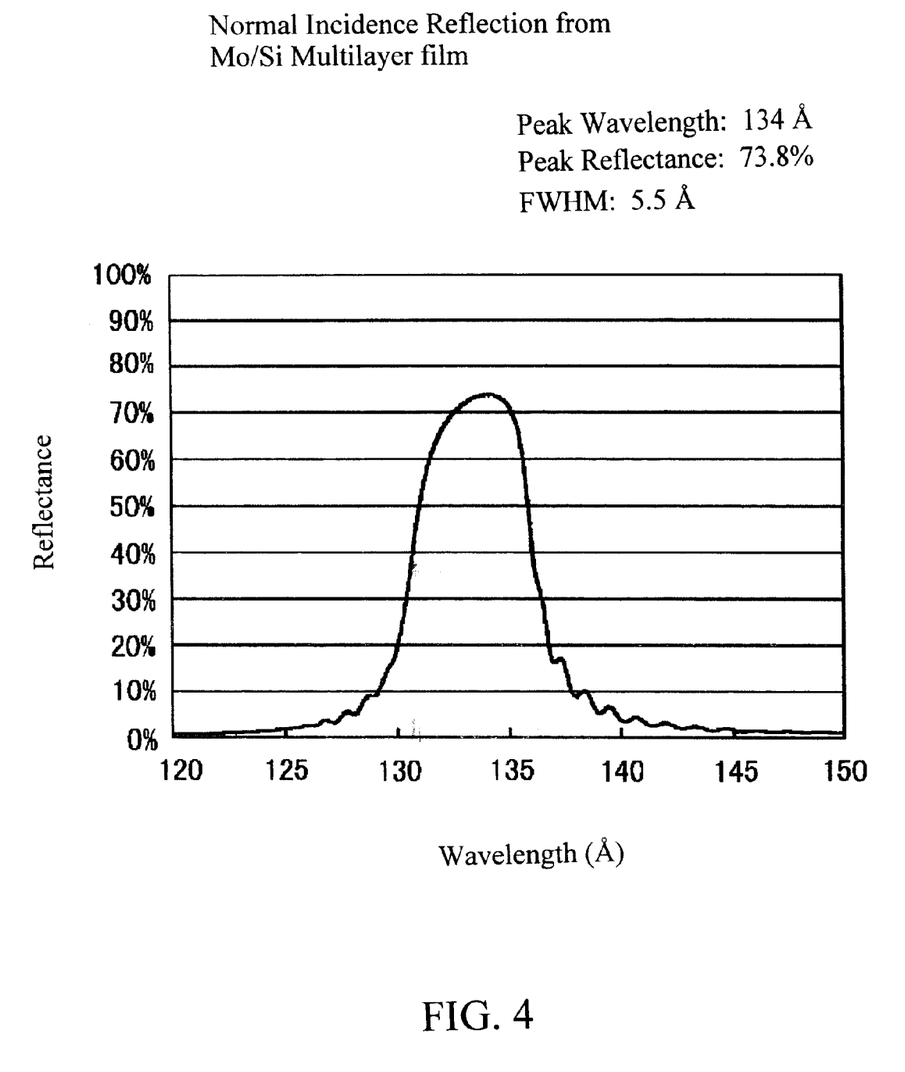
FIG. 4 is a reflectance spectrum of a reflective surface consisting of multiple alternating layers of molybdenum and silicon, at a constant thickness period through the thickness dimension.
Figure 5:
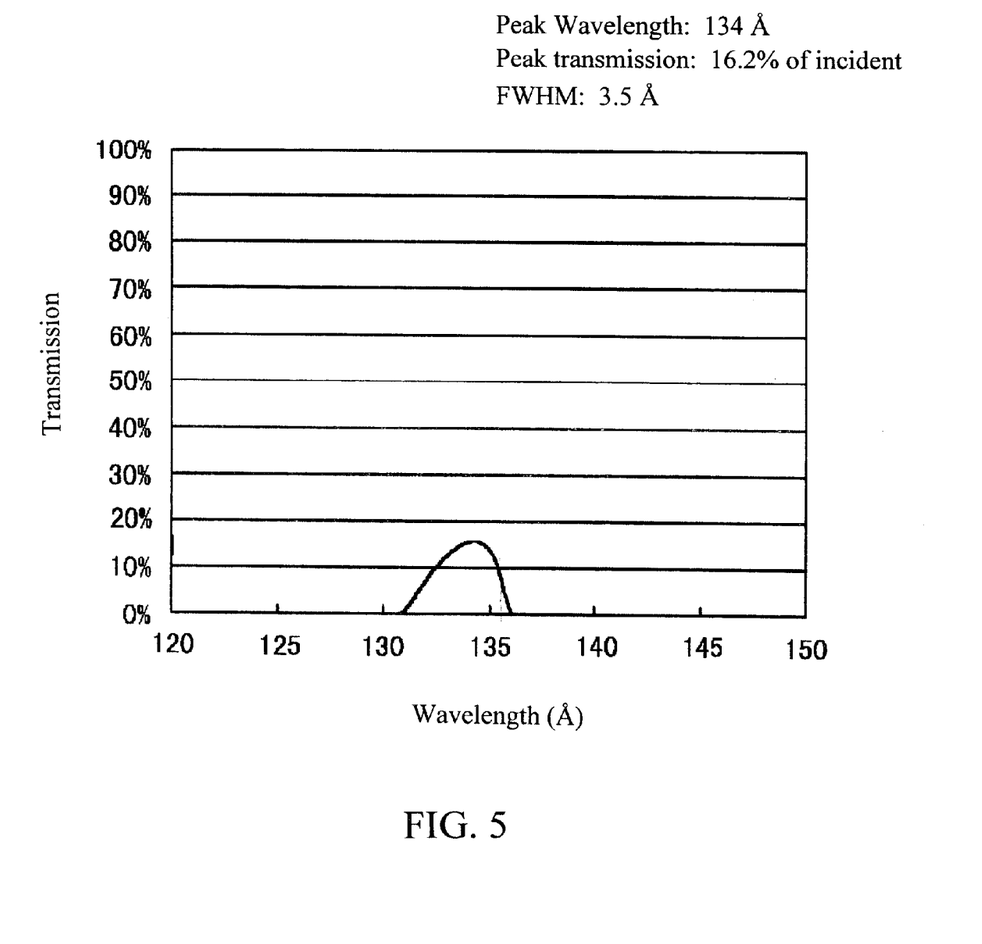
FIG. 5 is a transmission spectrum for an optical system comprising six mirrors each having a reflective surface as profiled in FIG. 4.

Thus, the exposure apparatus of FIG. 3 comprises six mirrors each including a Mo/Si multilayer. A typical reflection spectrum from one of such mirrors is shown in FIG. 4, showing a nominal reflectance of 73.8% and a FWHM of 0.55 nm. Specifically, the proportion of incident light passing through such an optical system is $(0.738)^6 = 16.2\%$, as shown in the transmission spectrum of FIG. 5. In FIG. 5, the FWHM of the spectrum is 0.35 nm. If a difference should exist between the center wavelength of reflected light from the reflection mask and the center wavelength of light passing through the 6-mirror optical system, then the quantity of light (percentage of incident light entering the optical system) actually reaching the wafer 10 is even smaller than $11.9\% = (0.738)^7$, including mask reflectance. The larger the number of reflection mirrors used in the optical system, the larger the value of a ratio of the percent of incident light passing through the optical system to the magnitude of the difference in center wavelengths.

In view of the above, whenever a reflection-type mask 18 is used with an optical system comprising multiple reflection mirrors each including a multilayer, it is highly desirable to reduce as much as possible any shifts in center wavelengths of reflected light from all portions of the multilayer mirror of the mask 18.

If there are any non-uniformities in the plane at the thickness period of the multilayer mirror of the reflection mask 18, then illumination non-uniformities will occur at the wafer 10. In an illumination non-uniformity, the quantity of light reaching the wafer 10 (i.e., "exposure dose") varies with location on the exposed portion of the wafer. The linewidth of a circuit pattern transferred onto a particular locus of the wafer surface is a function of the exposure dose at that locus (i.e., the total amount of light energy incident on the locus). I.e., as the exposure dose changes, the linewidth changes. To prevent linewidth changes arising from changes in exposure dose, it is desirable that illumination non-uniformities on the wafer be limited to ±1 to ±2 percent or less.

Figure 6:
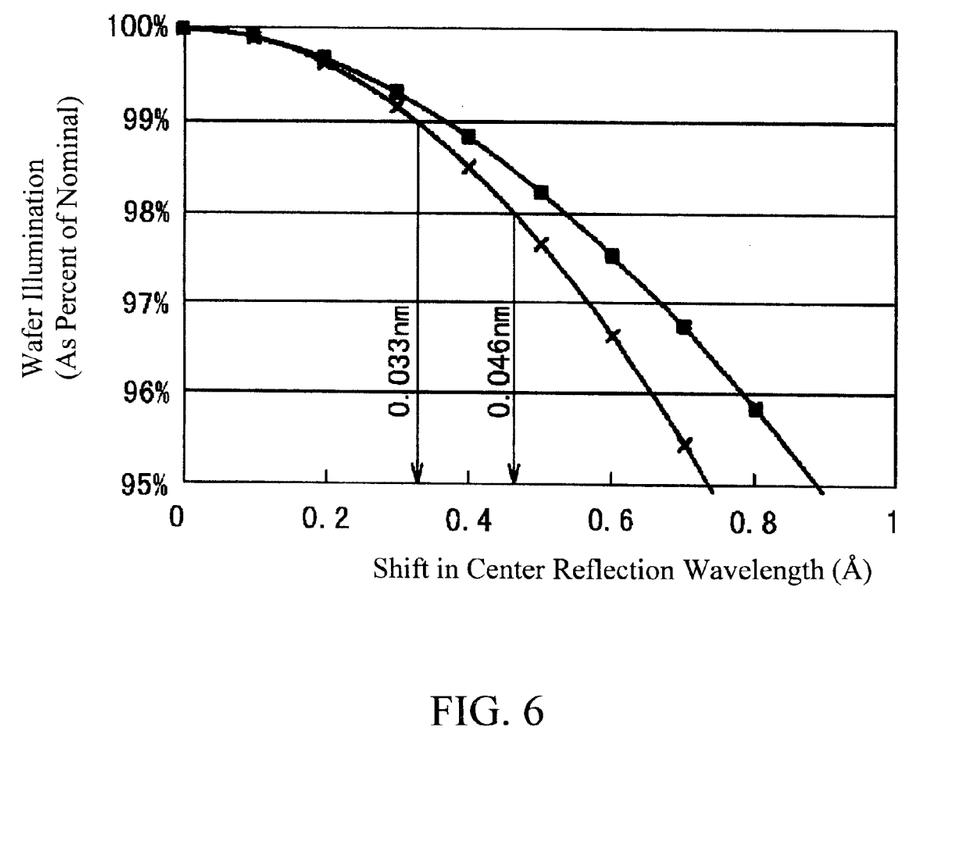
FIG. 6 includes two plots of wafer illumination versus shift in center wavelength of reflected light, under conditions of respective shifts in the center wavelength, using an optical system having the transmission spectrum of FIG. 5 and a reflection mask having the reflectance spectrum of FIG. 4.

FIG. 6 depicts a representative change in illumination on the wafer under a condition in which there has been a shift in the center wavelength of light passing through the optical system (having the transmittance spectrum shown in FIG. 5) relative to the center wavelength of light reflected from a reflection mask exhibiting the reflection spectrum shown in FIG. 4. In FIG. 6, if the shift in center wavelength is zero (i.e., no shift in center wavelength), then the wafer receives an amount of illumination that is 100% of nominal. FIG. 6 shows two curves. The curve representing a plot of square points corresponds to wavelength shifts to longer wavelengths, and the curve representing a plot of "x" points corresponds to wavelength shifts to shorter wavelengths.

As shown in FIG. 6, in order to limit changes in wafer illumination to within 1 percent (100%–99%), it is desirable that wavelength shifts be no greater than 0.033 nm, and that the ratio of the magnitude of center-wavelength shift (0.033 nm) to the center wavelength (13.4 nm) be no greater than 0.25 percent. Similarly, in order to limit changes in wafer illumination to within 2 percent, it is desirable that wavelength shifts be no greater than 0.046 nm, and that the ratio of the magnitude of center-wavelength shift (0.046 nm) to the center wavelength (13.4 nm) be no greater than 0.34 percent.

Therefore, it is especially desirable that the shift in center wavelength over the surface of the reflection mask be no greater than 0.34 percent at the wavelength used by the microlithography apparatus to make an exposure.

As noted above, less than the entire mask (i.e., less than an entire die on the wafer) normally is exposed at any one instant. Typically, the area of the wafer that is exposed at any one instant (i.e., the exposure-field size) is approximately 26×33 mm at a demagnification ratio β=¼. Under such conditions, the size of the exposure-field on the mask is approximately 104×132 mm. Over such an exposure field, it is normally very difficult to have the multilayer mirror on the mask exhibit variations in thickness period within a range of 0.34 to 0.25 percent.

To counteract this problem, according to the present embodiment, the FWHM of the reflectance spectrum of the reflection mask 18 is increased. This reduces the ratio of the change in illumination (on the wafer) to the shift in center reflection wavelength (at respective positions on the reflection mask). Hence, even if the magnitude of shift of center wavelength of reflected light is increased, the ratio of the change in reflectance to the change in wavelength remains small, thereby reducing the resulting change in illumination on the wafer.

Figure 7:
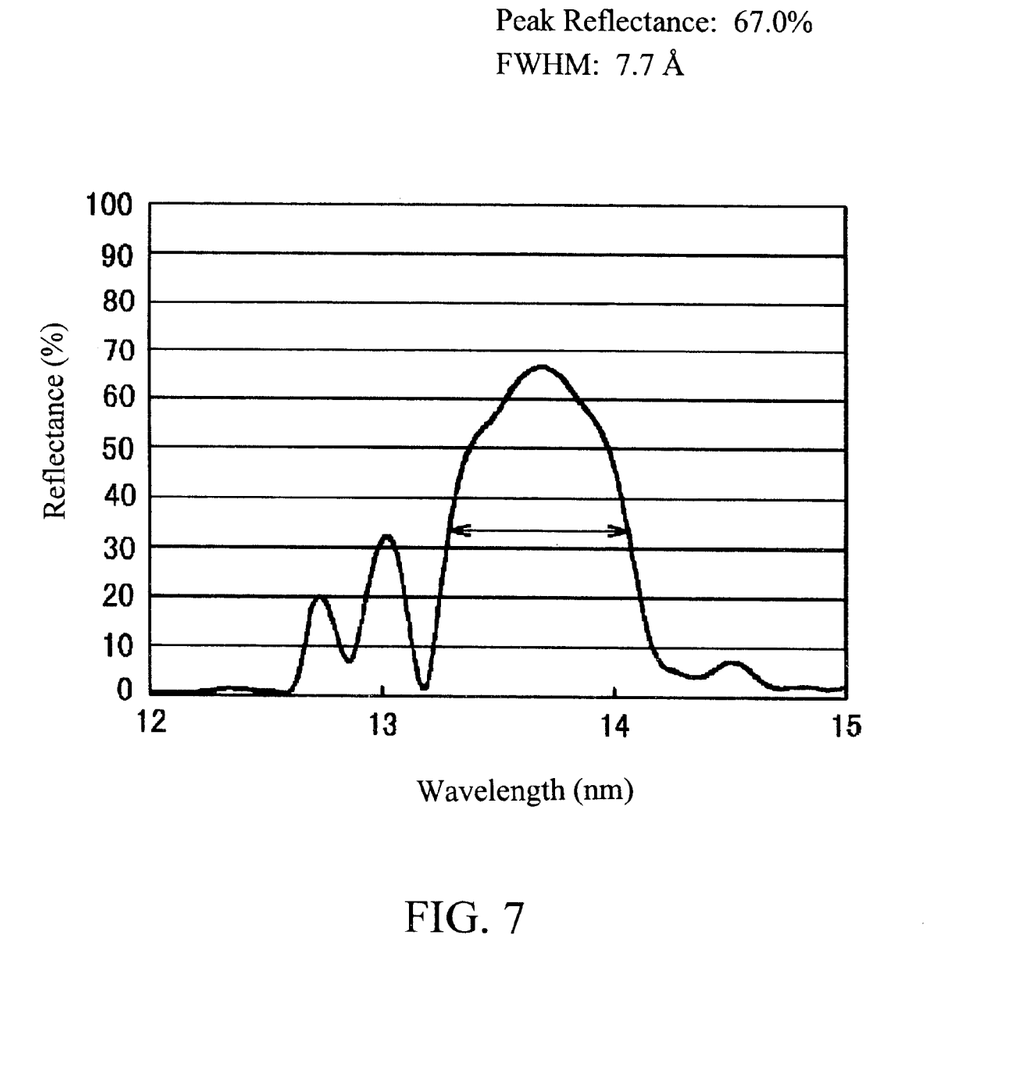
FIG. 7 is a reflectance spectrum of a reflective surface, according to a representative embodiment of the invention, comprising a Mo/Si multilayer comprising two blocks of laminates, each block having a different thickness period.

According to the invention, an increase in FWHM of the reflectance spectrum of the reflection mask can be achieved by forming the multilayer mirror of the mask using alternating layers of molybdenum and silicon configured as, for example, two blocks (see FIG. 2(b)). An example reflectance spectrum of such a reflection mask is shown in FIG. 7. In this reflection mask, the difference in thickness period between the two blocks is 0.4 nm. In FIG. 7, even though the peak reflectance is slightly lower (67 percent) than the peak reflectance (74%) shown in FIG. 4, the FWHM in the FIG.-7 spectrum is substantially larger (0.77 nm compared to 0.55 nm in FIG. 4).

Figure 8:
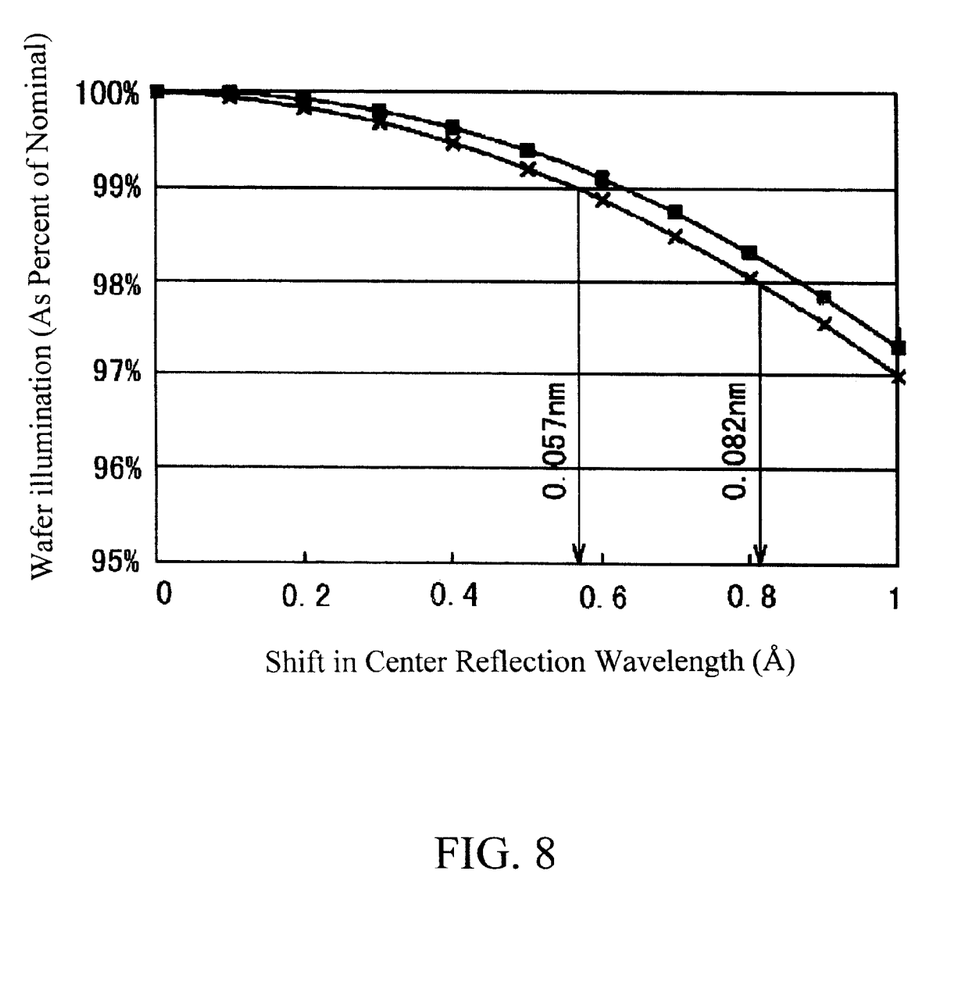
FIG. 8 includes two plots of wafer illumination versus shift in center wavelength of reflected light, under conditions of respective shifts in the center wavelength, using an optical system having the transmission spectrum of FIG. 5 and a reflection mask having the reflectance spectrum of FIG. 7.

The beneficial effect of using the FIG.-7 mask is illustrated in FIG. 8. Specifically, FIG. 8 depicts a representative change in illumination on the wafer under a condition in which there has been a shift in the center wavelength of light passing through the 6-mirror optical system (having the transmittance spectrum shown in FIG. 7) from the two-block reflection mask. In FIG. 8, if the shift in center wavelength is zero, then the wafer receives an amount of illumination that is 100% of nominal. FIG. 8 shows two curves. The curve representing a plot of square points corresponds to wavelength shifts to longer wavelengths, and the curve representing a plot of "x" points corresponds to wavelength shifts to shorter wavelengths.

As shown in FIG. 8, limiting changes in wafer illumination to within 1 percent can be obtained with wavelength shifts within a tolerance of no greater than 0.057 nm (compare to 0.034 nm in FIG. 6). Also, the ratio of the magnitude of center-wavelength shift (0.057 nm) to the center wavelength (13.7 nm) is within 0.43 percent (compare to 0.25 percent in FIG. 6), representing an approximately 70 percent improvement. The tolerance with respect to shifts of the thickness period in the direction within the plane of the reflection mask is correspondingly larger. Similarly, limiting changes in wafer illumination to within 2 percent can be obtained with wavelength shifts within a tolerance of no greater than 0.082 nm; the ratio of the magnitude of center-wavelength shift (within the plane of the reflection mask) to the center wavelength for which the mask is designed is now within 0.61 percent (compare to 0.34 percent in FIG. 6), also representing a 70-percent increase.

Therefore, whenever a reflection mask including a multilayer mirror divided into two blocks with different respective thickness periods is used as described above, and the reflection mask has experienced a drop in peak reflectance, the resulting drop in illumination on the wafer is only approximately 10 percent compared to a much higher drop when a reflection mask is used having a multilayer mirror with only one thickness period. (I.e., total reflectance determined from FIGS. 4 and 5, compared to FIGS. 5 and 7, yields a 10% difference.)

Figure 9:
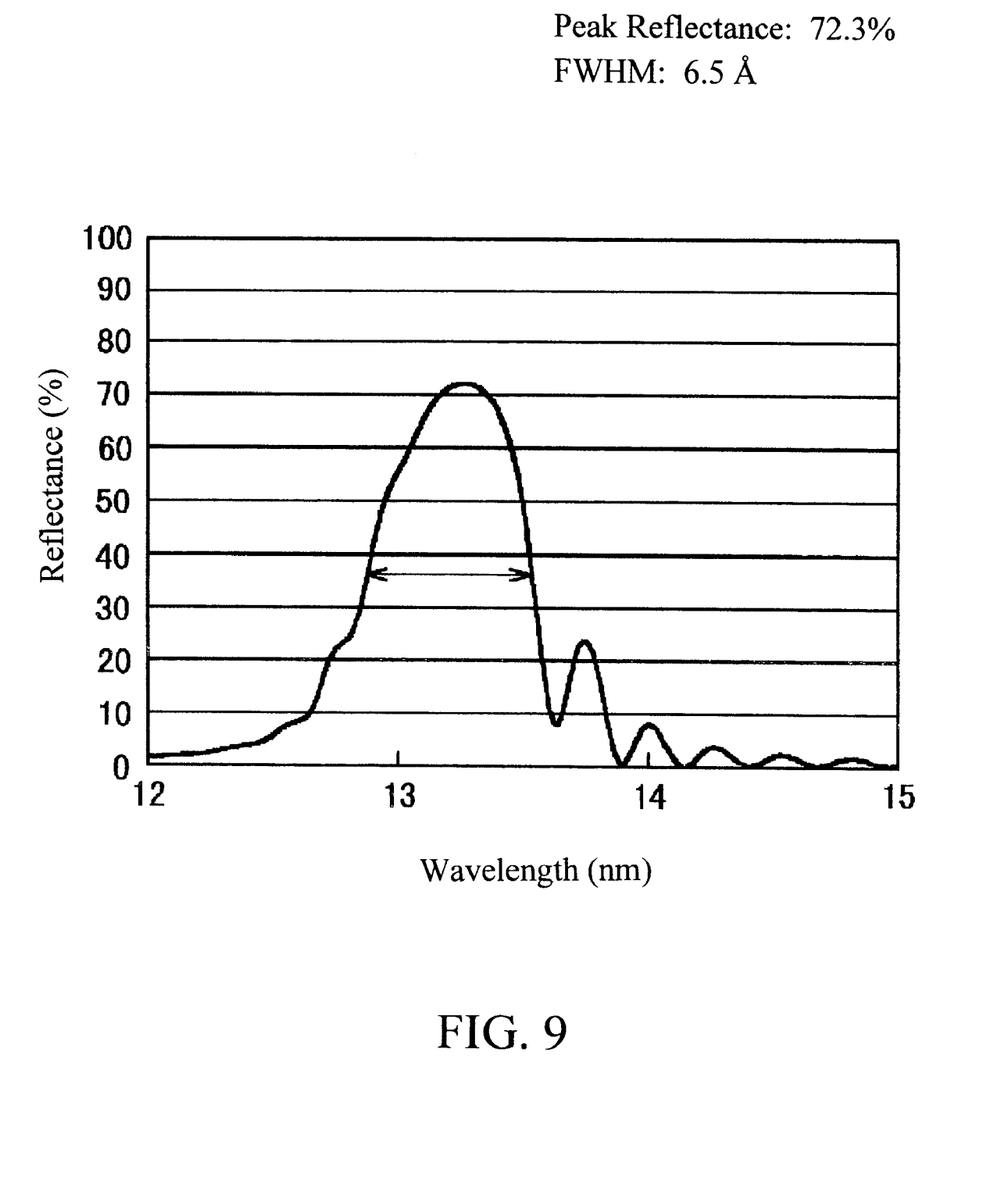
FIG. 9 is a reflectance spectrum of a reflective surface, according to another representative embodiment of the invention, comprising a Mo/Si multilayer in which the thickness period of pairs of Mo and Si laminates changes progressively through the thickness dimension of the reflective surface.

FIG. 9 shows a reflection spectrum obtained with a reflection mask comprising a multilayer mirror made of alternating layers of molybdenum and silicon, in which the thickness period progressively changes through the thickness dimension (see FIG. 2(c)). In the mask used to produce FIG. 9, the difference in the thickness period between the substrate side and the surface side is 0.4 nm. With this mask, the peak reflectance is 72.3 percent (FIG. 9), and the FWHM is 0.65 nm (compare to 0.55 nm in FIG. 4).

Figure 10:
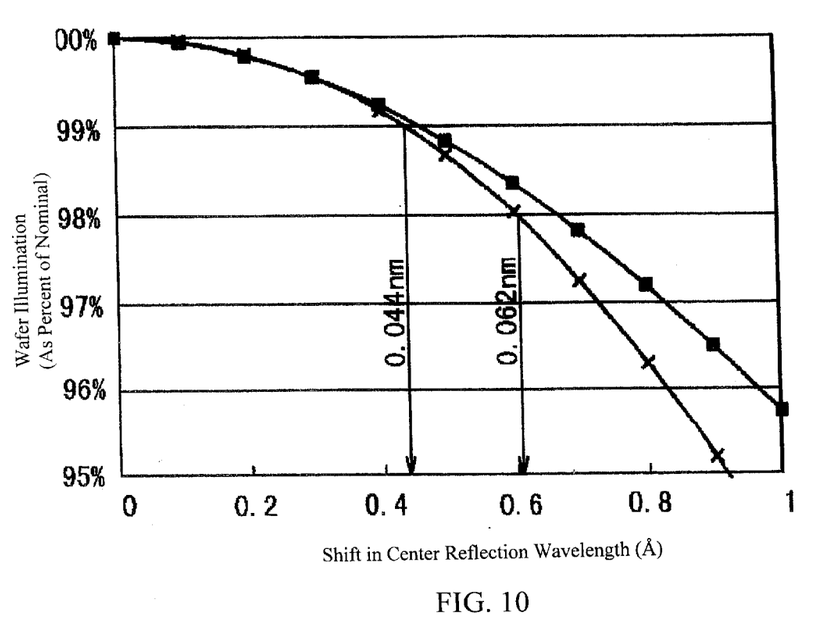
FIG. 10 includes two plots of wafer illumination versus shift in center wavelength of reflected light, under conditions of respective shifts in the center wavelength, using an optical system having the transmission spectrum of FIG. 5 and a reflection mask having the reflectance spectrum of FIG. 9.

The beneficial effect of using the FIG.-9 mask is illustrated in FIG. 10. Specifically, FIG. 10 depicts a representative change in illumination on the wafer under a condition in which there has been a shift in the center wavelength of light passing through the 6-mirror optical system (having the transmittance spectrum shown in FIG. 9) from the reflection mask. In FIG. 10, if the shift in center wavelength is zero, then the wafer receives an amount of illumination that is 100% of nominal. FIG. 10 shows two curves. The curve representing a plot of square points corresponds to wavelength shifts to longer wavelengths, and the curve representing a plot of "x" points corresponds to wavelength shifts to shorter wavelengths.

As shown in FIG. 10, limiting changes in wafer illumination to within 1 percent can be obtained with wavelength shifts within a tolerance of no greater than 0.044 nm (compare to 0.034 nm in FIG. 6). Also, the ratio of the magnitude of center-wavelength shift to the center wavelength is within 0.33 percent (compare to 0.25 percent in FIG. 6), representing a 30-percent increase. Similarly, limiting changes in wafer illumination to within 2 percent can be obtained with wavelength shifts within a tolerance of no greater than 0.062 nm; the ratio of the magnitude of center-wavelength shift (within the plane of the reflection mask) to the center wavelength for which the mask is designed is now within 0.46 percent (compare to 0.34 percent in FIG. 6), again representing an increase of approximately 30 percent. Furthermore, drops in illumination on the wafer are hardly apparent at all using this mask.

Figure 11:
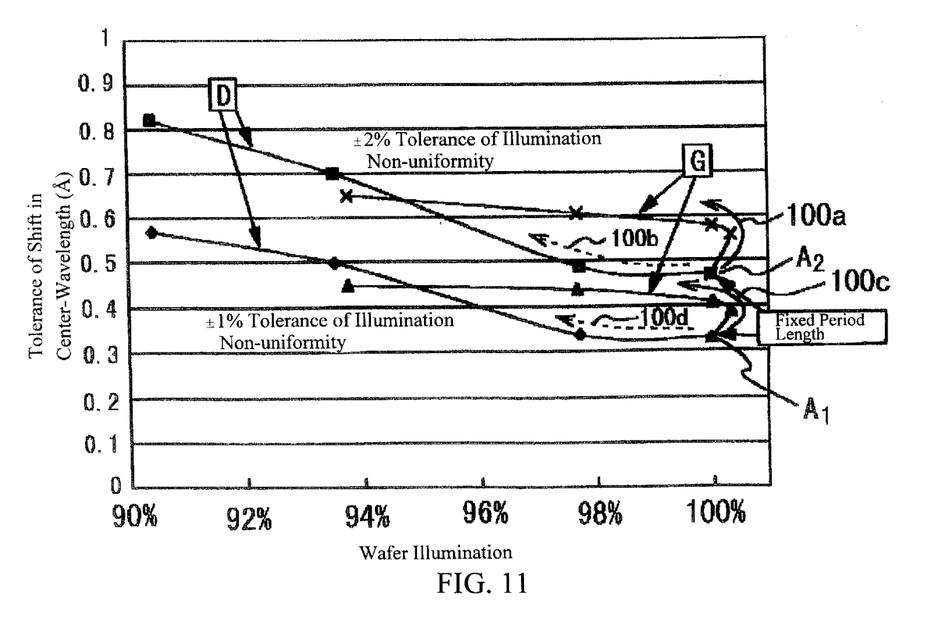
FIG. 11 includes plots showing respective relationships between respective increases in the tolerance of shifts in center wavelength versus respective decreases in wafer illumination, as exhibited by a representative reflection mask according to the invention.

FIG. 11 depicts certain relationships of the increase in the tolerance of shifts in center wavelength and the reduction in illumination on the wafer as obtained with two types of reflection mask according to the invention: (a) a mask in which the multilayer mirror is formed by a two-block laminated structure with different thickness periods, and (b) a mask in which the multilayer mirror is formed by a laminated structure in which the thickness period changes in a progressive manner through the thickness dimension. In FIG. 11, the reflection mask in which the multilayer mirror is formed by laminated molybdenum/silicon layers having fixed thickness periods is regarded as providing a wafer illumination of 100 percent.

The two curves shown in FIG. 11 represent the relationship between the tolerance of shifts in center wavelength at any location on the reflection mask and the corresponding illumination on the wafer whenever the tolerances of illumination non-uniformity are ±1 percent and ±2 percent, respectively. The upper right position in this graph is desirable because, the farther one moves toward the upper right of this graph, the more the illumination on the wafer increases and the greater the increase in the tolerance of wavelength shifts.

With the respective curves $A_1$ and $A_2$ as starting points, regions in the direction of arrow 100*a* or arrow 100*c* reflect the relationship in respective cases in which the thickness periods of the multilayer mirror on the mask have been changed in a progressive manner. (In the figure, these are the portions denoted by "G".) Situations are shown in which the difference in the thickness periods on the substrate side and on the surface side become larger with movement along the curve from $A_1$ or $A_2$ in the direction of the arrow 100*a* or 100*c*, respectively.

On the other hand, with the respective curves $A_1$ and $A_2$ as starting points, regions in the direction of arrow 100*b* or arrow 100*d* reflect the relationship in respective cases between illumination onto the wafer and the tolerance of shifts in center wavelength whenever the mask has a multilayer mirror having a two-block configuration with different respective thickness periods. (In the figure, these are the portions denoted by "D".) As one moves farther on the curve from $A_1$ or $A_2$ in the direction of the arrow 100*b* or 100*d*, respectively, the difference in the thickness periods of the two blocks becomes larger. The locations of the respective curves $A_1$ or $A_2$ pertain to a mask having a multilayer mirror in which the thickness period is fixed.

A mask having a two-block multilayer mirror with two different thickness periods has a different behavior than a mask having a multilayer mirror in which the thickness period changes in a progressive manner through the thickness dimension. In situations in which the tolerance of the shift in center-wavelength of reflected light from various locations on the reflection mask is relatively low, using a reflection mask having a multilayer mirror in which the thickness period progressively changes would exhibit almost no drop in reflectance. It is thus possible to increase the FWHM of the reflectance spectrum, with substantial effect. In situations in which the tolerance of the shift in center-wavelength of reflected light from various locations on the reflection mask is relatively large, it may be more efficient to use a reflection mask having a multilayer mirror having a two-block structure, wherein each block has a different thickness period.

With FIG. 11, it is possible to consider the reduction in wafer illumination with an increase in tolerance of wavelength shifts, and to select optimal parameters.

A microlithographic exposure apparatus that uses a reflection mask according to the invention exhibits substantial advantages when used to manufacture integrated circuits and the like. In this regard, an exemplary semiconductor integrated-circuit manufacturing process is summarized below that uses such a microlithographic exposure apparatus. The process comprises a wafer-preparation step, a mask-preparation step, at least one wafer-processing step, a chip-assembly step, and a chip-inspection step. The wafer-processing step comprises a thin-film-formation step, an oxidation step, a resist-coating step, an exposure step, an etching step, an ion-implantation step, a resist-stripping step, and a washing step. Whenever semiconductor-device manufacturing is performed using a microlithographic exposure apparatus, according to the invention, to perform the exposure step, it is possible to transfer linewidths onto the wafer with high accuracy and to increase the yield of acceptable product.

The invention is further described in the context of examples. It will be understood that the examples are not limiting in any way.

EXAMPLE 1

To manufacture a reflection mask, a silicon substrate was used having a diameter of 8 inches and a thickness of 10 mm. The surface of the silicon substrate was polished to a planarity within 0.2 nm (surface roughness RMS value). Ion-beam sputtering was used to laminate thin films of molybdenum (Mo) and silicon (Si) alternately on the polished surface of the substrate, thereby forming a surficial multilayer mirror. The thickness period of the first 25 layer pairs was 6.5 nm. A second group of 25 layer pairs had a thickness period of 6.9 nm.

To improve the planar uniformity of the film-thickness distribution for the layers, layer formation was performed while using a film-thickness-compensation plate immediately in front of the substrate. See, Murakami et al., *Applied Optics* 32:7057–7061, 1993, especially page 7059 and FIG. 3. This reference is incorporated herein by reference. In this way, alternating layers of silicon and molybdenum (50 layer pairs in total) were formed in which the difference in thickness period between the first block and the second block was only 0.4 nm. The uppermost layer of the multilayer mirror was a molybdenum layer.

Measurements revealed that this multilayer mirror exhibited a reflection characteristic nearly identical to that shown in FIG. 7.

At this stage, the in-plane uniformity of the center wavelength of light reflected from the multilayer mirror was evaluated. To produce an illumination uniformity on the wafer of no more than ±1 percent, as shown in FIG. 8, the tolerance of the center-wavelength distribution was 13.4 nm ±0.057 nm (i.e., within ±0.43 percent). By way of comparison, a conventional multilayer mirror comprising alternating layers of molybdenum and silicon having a fixed thickness period exhibited a center-wavelength distribution in which the tolerance was 13.4 nm ±0.033 nm (i.e., within ±0.25 percent). Hence, a multilayer mirror according to this example exhibited a tolerance of center-wavelength distribution that was approximately 70 percent greater than a conventional multilayer mirror. As a result of the achieved wider tolerance, the yield of acceptable product was improved substantially over conventional methods.

Formation of an EUV-absorbing layer was performed using an electrolytic plating technique, as disclosed in Murakami et al., *Jpn. J. Appl. Phys.* 34:6696–6700, 1995. After applying a layer of photoresist onto the multilayer mirror, the desired circuit pattern was drawn on the resist using an electron beam. After development of the resist, and using remaining resist as a mask, a 100-nm-thick EUV absorber layer of nickel was applied by electrolytic plating. The remaining resist was stripped to complete manufacture of a reflection mask such as that shown in FIG. 1.

EXAMPLE 2

The surface of a 230-mm square glass substrate (ULE low-thermal-expansion glass made by Corning, 20-mm thick) was polished to within 0.2-nm planarity (surface roughness RMS value). High-frequency magnetron sputtering was used to apply alternating layers of molybdenum (Mo) and silicon (Si) on the polished surface, thereby forming a multilayer mirror comprising alternating layers of molybdenum and silicon. Fifty pairs of layers were applied. The thickness period of the first pair of layers (one layer of Mo and one layer of Si) was 6.68 nm. The thickness period was increased in a progressive manner with each subsequent pair of layers, wherein the thickness period of the uppermost pair of layers 7.08 nm. Thus, the increase in thickness period from the first to the 50th layer pair was 0.4 nm.

To improve the uniformity of the layer-thickness distribution over the surface of the substrate, film formation was performed while using a film-thickness-compensation plate situated immediately in front of the substrate. The uppermost layer was a silicon layer. Measurements revealed that this reflective member exhibited a reflection characteristic that was nearly the same as shown in FIG. 9.

The in-plane uniformity of the reflection center wavelength of the multilayer mirror was evaluated. To ensure an illumination non-uniformity on the wafer of ±2 percent, as shown in FIG. 10, the tolerance of the center-wavelength distribution was within 13.4 nm ±0.062 nm (i.e., within ±0.46 percent). Hence, compared to a conventional molybdenum/silicon multilayer having a fixed thickness period, the center wavelength distribution of this example exhibited a tolerance of 13.4 nm ±0.046 nm (within ±0.34 percent). Hence, the tolerance of center-wavelength distribution was increased by approximately 30 percent relative to the conventional reflective member. Such an increase in the tolerance produces a corresponding increase in the yield of the manufacturing process for making such reflective members.

Application of an EUV-absorbing layer to the multilayer mirror of this example was performed by dry etching as described in Oshino et al., Japanese Kôkai Patent Application No. Hei 52-185739. Specifically, high-frequency magnetron sputtering was used to form a 10-nm thick intermediate carbon layer on the multilayer of molybdenum and silicon. Then, a 100-nm thick layer of tungsten (W) was formed. The intermediate layer of carbon prevents damage to the multilayer during a subsequent etching of the absorber (W) layer. A photoresist was applied to the W layer and patterned using electron-beam drawing. The resist was developed. Dry etching of the W layer was performed using an RIE (Reactive Ion Etching) apparatus and a reaction gas mainly comprising $CF_4$. Etching of the C layer was performed using oxygen ($O_2$) gas. Lastly, the photoresist was stripped to complete formation of a reflection mask such as that shown in FIG. 1.

Therefore, according to the present invention, the tolerance of the in-plane distribution of center wavelength of reflected EUV light from a multilayer used in the reflection mask is increased sufficiently to substantially improve the manufacturing yield and reduce the manufacturing cost of reflection masks as used in microlithography.

Whereas the invention has been described in connection with representative embodiments and examples, it will be understood that the invention is not limited to those embodiments and examples. On the contrary, the invention is intended to encompass all alternatives, modifications, and equivalents as may be included within the spirit and scope of the invention, as defined by the appended claims.

What is claimed is:

1. A reflection mask for use in microlithography, the reflection mask comprising:
    a multilayer mirror that reflects incident electromagnetic radiation of a prescribed wavelength; and
    an absorptive layer superposed on the multilayer mirror, the absorptive layer defining elements of a pattern defined by the mask, wherein the multilayer mirror has a thickness period, through a thickness dimension of the multilayer mirror, that varies through the thickness dimension.

2. The reflection mask of claim 1, wherein the electromagnetic radiation comprises soft-X-rays.

3. The reflection mask of claim 1, wherein the multilayer mirror is formed by laminating multiple blocks of multilayer, each block having a different thickness period.

4. The reflection mask of claim 3, wherein one layer of each multilayer includes silicon, and another layer of each multilayer includes molybdenum.

5. The reflection mask of claim 1, wherein the multilayer mirror is formed by laminating multiple multilayers superposedly such that the multilayer mirror has a thickness period that varies progressively with distance through a thickness dimension of the multilayer.

6. The reflection mask of claim 5, wherein one layer of each multilayer includes silicon, and another layer of each multilayer includes molybdenum.

7. In a method for performing microlithography of a pattern, defined by a reflection mask, onto a substrate, a method for reducing adverse effects on linewidth of the pattern, as transferred to the substrate, caused by a non-uniformity of reflection of illumination light from the reflection mask, the method comprising:
    providing a reflection mask as recited in claim 1;
    illuminating the reflection mask with the illumination light; and
    passing the reflected illumination light through an imaging-optical system to as to form an image of the pattern on the substrate.

8. A microlithography apparatus, comprising:
    an illumination-optical system situated and configured to irradiate electromagnetic radiation from a source onto a reflection mask, the reflection mask defining a pattern to be projected onto a substrate;
    an imaging-optical system situated and configured to direct portions of the electromagnetic radiation reflected from the reflection mask to the substrate so as to form an image of the pattern on the substrate; and
    the reflection mask comprising a multilayer mirror that reflects a prescribed wavelength of the electromagnetic radiation and an absorber layer, superposed on the multilayer mirror, that absorbs the electromagnetic radiation and defines elements of the pattern, the multilayer mirror having a thickness period, through a thickness dimension of the multilayer mirror, that varies through the thickness dimension.

9. The apparatus of claim 8, wherein:
    the electromagnetic radiation comprises soft X-rays; and
    the multilayer mirror of the reflection mask is reflective to the soft X-rays.

10. In a method for manufacturing an integrated circuit, a microlithography step in which a circuit pattern, defined on a mask, is transferred to a wafer to form the circuit pattern on the wafer, the microlithography step being performed using a reflection mask comprising a multilayer mirror that reflects a prescribed wavelength of electromagnetic radiation and an absorber layer, superposed on the multilayer mirror, that absorbs the electromagnetic radiation and defines elements of the pattern, the multilayer mirror having a thickness period, through a thickness dimension of the multilayer mirror, that varies through the thickness dimension.

11. The method of claim 10, wherein the electromagnetic radiation comprises soft X-rays.

* * * * *

UNITED STATES PATENT AND TRADEMARK OFFICE
CERTIFICATE OF CORRECTION

PATENT NO. : 6,333,961 B1
DATED : December 25, 2001
INVENTOR(S) : Katsuhiko Murakami It is certified that error appears in the above-identified patent and that said Letters Patent is hereby corrected as shown below:

Column 5,
Line 33, ".period." should be -- period. --

Column 13,
Line 48, "52-185739." should be -- 5-185739. --

Column 14,
Line 41, "the · reflection" should be -- the reflection --
Line 45, "to as to" should be -- so as to --.

Signed and Sealed this

Eighteenth Day of February, 2003

JAMES E. ROGAN
*Director of the United States Patent and Trademark Office*